United States Patent

Ren et al.

[11] Patent Number: 6,078,011
[45] Date of Patent: Jun. 20, 2000

[54] METHOD FOR DISSIPATING HEAT AWAY FROM A HEAT SENSITIVE DEVICE USING BICARBONATE COMPOSITION

[75] Inventors: Jane Ren, Morris Plains; Christopher E. Osuch, Mine Hill, both of N.J.; Richard A. Olzak, Kirkland, Wash.; Amanda L. Plyley, Scotch Plains, N.J.

[73] Assignee: AlliedSignal Inc., Morristown, N.J.

[21] Appl. No.: 09/307,260

[22] Filed: May 6, 1999

Related U.S. Application Data

[63] Continuation of application No. 09/052,913, Mar. 31, 1998, which is a continuation-in-part of application No. 08/963,879, Nov. 4, 1997, Pat. No. 5,932,839.

[51] Int. Cl.$^7$ ...................................................... H05K 5/00
[52] U.S. Cl. ................................ 174/175 F; 174/17 VA
[58] Field of Search .......................... 174/175 F, 17 VA, 174/50, 48; 361/708, 709, 717

[56] References Cited

U.S. PATENT DOCUMENTS

| | | | |
|---|---|---|---|
| 2,079,231 | 5/1937 | Smith | 175/41 |
| 2,279,791 | 4/1942 | Lamb | 106/601 X |
| 2,361,249 | 10/1944 | Venable | 175/361 |
| 2,761,891 | 9/1956 | Violette | 174/17 |
| 3,179,853 | 4/1965 | Kozacka | 317/100 |
| 4,230,901 | 10/1980 | Wengler et al. | 361/386 X |
| 4,888,663 | 12/1989 | Longerich et al. | 361/385 |
| 5,032,690 | 7/1991 | Bloom | 174/48 |

*Primary Examiner*—Dean A. Reichard

[57] ABSTRACT

Methods for heat absorption and heat dissipation, by enclosing a heat sensitive device with between about 10 percent and about 99 percent by weight of a bicarbonate compound. The bicarbonate compound is optionally combined with between about 90 percent and about 1 percent by weight of binder.

8 Claims, 2 Drawing Sheets

6,078,011

METHOD FOR DISSIPATING HEAT AWAY FROM A HEAT SENSITIVE DEVICE USING BICARBONATE COMPOSITION

PRIORITY

This application is a continuation of application Ser. No. 09/052,913, filed Mar. 31, 1998, which is a continuation-in-part of application Ser. No. 08/963,879, filed Nov. 4, 1997, now U.S. Pat. No. 5,932,839.

FIELD OF THE INVENTION

The present invention relates generally to methods and compositions useful for heat absorption, particularly in high temperature environments.

BACKGROUND OF THE INVENTION

Present products for protecting heat sensitive materials from a high temperature environment fail to adequately protect the materials from the intense heat that can occur in building fires or fires resulting from catastrophic aircraft failure or aircraft ground impact.

SUMMARY OF THE INVENTION

As a first aspect, the present invention provides a method for dissipating heat away from a heat sensitive device exposed to a high temperature environment. The method includes surrounding the heat sensitive device with a composition including: a) between about 10 percent and about 99 percent by weight of a bicarbonate compound; and b) between about 90 percent and about 1 percent by weight of a binder. Optionally the bicarbonate of soda may be used without any binder material. The bicarbonate compound undergoes endothermic decomposition when exposed to said high temperature environment, and the composition absorbs heat from the high temperature environment during the endothermic decomposition of the bicarbonate compound and thereby dissipates heat away from the heat sensitive device.

These and other aspects of the present invention are described further in the detailed description of the preferred embodiments of the invention which follow.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
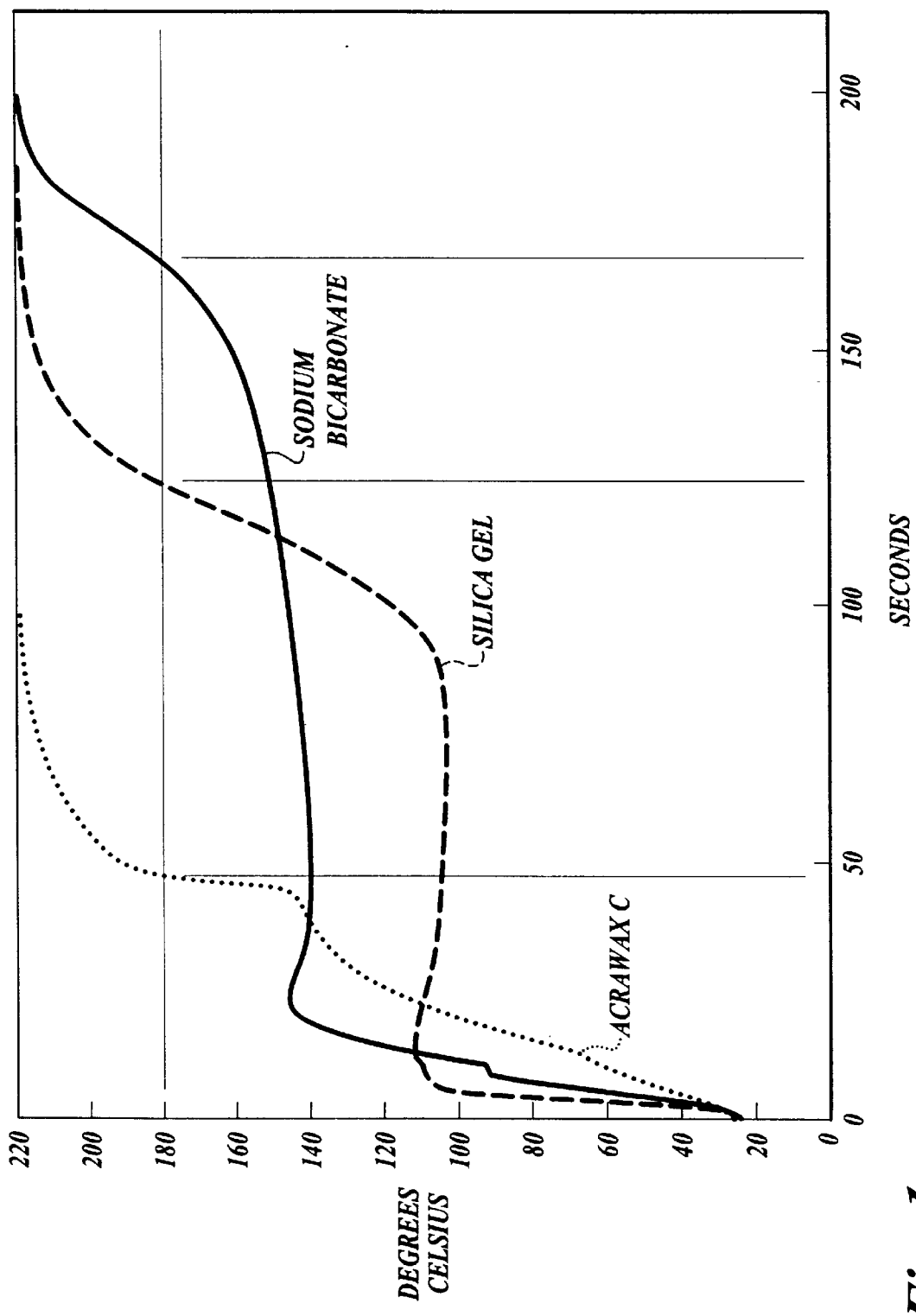
FIG. 1 is a graphical representation of the time versus temperature curves for the compositions of the present invention as well as conventional heat absorption compositions employed in thermally protected enclosures such as flight data recorders.

As used herein, all terms have their ordinary meaning in the art unless otherwise indicated. All percentages are percent by weight unless otherwise indicated. The term "bicarbonate" as used herein refers to agents which contain the $HCO_3-$ anion. In particular, bicarbonates according to the present invention generate carbon dioxide during decomposition.

The methods of the present invention involve the use of certain bicarbonate compositions which are characterized in that they absorb heat from a high temperature environment and dissipate this heat away from a heat sensitive device. Such compositions are particularly useful in thermally protected enclosures such as flight data recorders. The compositions of the present invention are designed to possess greater heat absorption, and thus heat dissipating, characteristics than conventional heat absorption compositions which are currently employed in flight data recorders to absorb and dissipate heat away from heat sensitive devices. The heat absorption characteristics of the composition are useful for providing thermal insulation to heat sensitive devices within the enclosure in a fire or other high temperature environment. In accordance with the present invention, the composition absorbs heat from the high temperature environment during the endothermic decomposition of the bicarbonate component of the composition. The absorption of heat from the high temperature environment effectively dissipates the heat away from the heat sensitive devices by controlling the temperature rise within the interior compartment of the flight data recorder. As a result, the temperature to which the heat sensitive devices are exposed does not rise to a level at which the heat sensitive devices will be damaged even though the temperature to which the flight data recorder is exposed is significantly higher than the temperature at which damage to the heat sensitive device will occur.

The temperature at which the endothermic decomposition occurs is selected to be: (1) above the peak temperature encountered under normal operating conditions; and (2) at or below the peak temperature objective for the heat sensitive devices within the enclosure which are desirously protected from the high temperature environment.

The compositions employed in the methods and enclosures of the present invention include a bicarbonate compound with or without a binder. Suitable bicarbonate compounds will be readily apparent to those skilled in the art based upon the definition given hereinabove for "bicarbonate". Specific examples of suitable bicarbonate compounds include but are not limited to sodium bicarbonate, potassium bicarbonate and ammonium bicarbonate. Sodium bicarbonate is currently preferred because of its ready availability and low cost. The bicarbonate of soda may be used without any binder material.

The binder is typically a wax binder. Examples of suitable wax binders include but are not limited to polyethylene wax, polypropylene wax, oxidized polyethylene, copolymers of ethylene and comonomer, and copolymers of propylene and comonomer. Suitable comonomers include those monomers which are copolymerizable with ethylene or propylene, such as linear, branched, or cyclic alkene monomers including butene, hexene, pentene, octene, and higher homologs; acrylic acid; and vinyl acetate. These binders, including the copolymers, are commercially available. Preferred binders include oxidized polyethylene wax, paraffin wax, and poly(ethylene-vinyl acetate). Oxidized polyethylene wax is currently the most preferred binder for use in the compositions of the present invention.

Typically, the composition includes a) between about 10 percent and about 99 percent by weight inclusive, of the bicarbonate compound; and b) between about 90 percent and about 1 percent by weight inclusive, of the binder. More preferably the composition comprises a) between about 70 percent and about 99 percent by weight of the bicarbonate compound; and b) between about 30 percent and about 1 percent by weight of the binder. In one embodiment of the present invention, the composition comprises about 95 percent by weight of a bicarbonate compound and about 5 percent by weight of a binder. In an alternate embodiment of the invention, bicarbonate of soda is used without a binder material.

The bicarbonate compounds are typically in particulate form, such as powders, granules or the like. The binder is useful for aggregating the bicarbonate particles into a form which is desirable for the specific application of the composition. For example it is often desirable for compositions to be used in thermally protected enclosures to be molded into the general configuration of the interior cavity of the enclosure or smaller geometrically shaped units such as blocks or cubes. The binder holds the aggregated powder in the desired configuration. When a binder is not used, the bicarbonate compound material can be held in place around the heat protected device in the space defined by the shape of the interior cavity.

The composition may be prepared by manually combining the two components in a manner that provides a relatively uniform composition. The composition may be prepared by mechanically mixing, stirring or otherwise combining the components so as to provide a blend of uniform consistency. For example, the composition may be prepared by blending the binder into the particulate bicarbonate component. Once a composition of uniform consistency is achieved, the composition may be molded into any suitable shape by using relatively low pressure. The blocks which are often desirable for use in flight data recorders may be prepared using compression molding techniques. For example blocks may be prepared by grinding the wax binder below room temperature into a fine powder, mixing the powdered wax binder with the bicarbonate powder at a temperature of from between about 50° C. and about 95° C. at a pressure between about 5625 psi and about 22,500 psi. Typically, the higher temperatures and pressures are preferred in the compression molding of the compositions of the present invention.

The composition exhibits a reactivity temperature (i.e., the temperature at which the endothermic decomposition of bicarbonate begins) of from about 50° C. to about 200° C., a density of from about 0.5 g/cc to about 2.5 g/cc, and a pH, measured as a saturated solution, of from 7 to 10.

In a fire or other high temperature environment, the compositions of the present invention act as a heat shield initially, by exhibiting a relatively high thermal inertia. When the composition reaches the temperature at which decomposition of the bicarbonate compound begins, it acts as a heat sink by utilizing the heat energy of the environment to initiate and maintain the endothermic decomposition reaction of the bicarbonate. It is known that aqueous solutions of bicarbonate salts undergo decomposition to hydroxide salts and carbon dioxide is released. The solid state reaction, on the other hand, is believed to involve the decomposition of sodium bicarbonate to sodium carbonate, water, and gaseous carbon dioxide by an endothermic reaction mechanism. The term "endothermic" is well defined in the art and refers to reactions which require the input of heat energy to maintain the reacting mass at a constant temperature. Thus, the composition absorbs heat from the high temperature environment to drive the endothermic decomposition of the bicarbonate compound.

The use of the heat energy to initiate and drive this endothermic reaction has the effect of maintaining the maximum temperature environment within the enclosure at an acceptable level, i.e., a level which does not cause significant damage to the heat sensitive devices contained therein.

As a further advantage, it is noted that the endothermic decomposition of the bicarbonate compounds produces gaseous carbon dioxide which is useful for extinguishing fire. The expected gas evolution rate can be predicted from the heat flow anticipated in the final design. The heat flow can be estimated from the wall type and thickness, the insulation type and thickness (or thermal conduction coefficient) and the approximate physical size of the unit. Given the heat flow, the temperature profile and gas evolution rates can be estimated from each material's known thermochemical behavior.

The amount of carbon dioxide gas released from the composition is often significant. This provides the beneficial effect of extinguishing flames. However, a large build-up of gas within an airtight, rupture-proof enclosure housing the heat sensitive devices may cause pressure damage to such devices. Without venting, the pressure could rise excessively and the heat dissipation properties would also be lower. Accordingly, it is appropriate to design the flight recorder enclosure in a manner which permits the escape of the gaseous carbon dioxide product to achieve the maximum beneficial effects of the composition (i.e., avoid pressure damage to the devices contained therein and extinguish the flames on the interior and exterior of the enclosure).

FIG. 1 is a graphical representation of the time versus temperature characteristics of the compositions of the present invention as compared to Blue SiO2 powder which is a form of hydrated silica, and a synthetic amide-wax type heat absorption agent available under the tradename of ACRAWAX C® from Glyco, Inc. of Greenwich Conn. Both Blue silica and ACRAWAX C® are conventional heat absorption compositions. It can be seen from the graph, that bicarbonate compounds absorb at least as much and possibly more heat than the silica powder. The time required for the bicarbonate compound to reach a given temperature in a high temperature environment is as long or longer than the time required for the silica composition to reach the same temperature. This result demonstrates that the bicarbonate compounds are as effective or more effective than the conventional silica compositions at absorbing heat from the high temperature environment. The compositions of the present invention have an added advantage over conventional silica compositions in that they will not loose water in an unconfined space.

It can also be seen from the graph, that bicarbonate compounds absorb more heat than the conventional amide-type wax blend of ACRAWAX C®. The time required for the bicarbonate compound to reach a given temperature in a high temperature environment is longer than the time required for the wax composition to reach the same temperature. This result demonstrates that the bicarbonate compounds absorb larger quantities of heat from the high temperature environment.

The improved heat absorption properties observed with the bicarbonate compounds of the present invention as compared to conventional heat absorption compositions is a very important advantage in applications such as flight data recorders. In the event of a crash, the flight data recorder may be subjected to temperatures in the range of 1100° C. for up to an hour. Thus, it is clearly advantageous to use a heat absorption composition which absorbs more heat energy and thereby provides greater protection to the heat sensitive devices contained therein.

In addition to the foregoing, the compositions of the present invention provide a number of advantages. The components of the composition are safe, relatively easy to handle, relatively low in cost, formable, and more effective at heat absorption as compared to conventional heat absorption materials. Also, because the compositions of the present invention absorb heat more efficiently than conventional heat absorption agents, flight data recorders including the compositions of the present invention may be smaller than conventional flight data recorders.

The compositions of the present invention are particularly useful in enclosures for thermally protecting one or more heat sensitive devices from a high temperature environment, such as aircraft flight data recorders which include heat sensitive devices for recording and storing data. Flight data recorders are known in the art and are configured to provide a record of various important aircraft performance parameters over a predetermined time interval. Flight data recorders record performance parameters continuously from the time the electrical system of the aircraft is activated. Because they have a limited memory they can only hold information relating to such parameters for the predetermined time interval. Hence, as new data is continuously collected, it is continuously written over old data. In the event that the flight data recorder is deactivated, which occurs if the aircraft crashes, the flight data recorder will retain in memory the performance parameters recorded over the predetermined time interval immediately prior to deactivation. In operation, the information stored within a memory unit is continually supplied by additional components of the flight data recorder system such as a data acquisition unit that receives input signals from various aircraft sensors and systems, and processes those signals to produce signals compatible with the recording or storage medium employed by the flight data recorder memory unit.

The compositions of the present invention may be employed in any conventional thermally protected flight data recorder, including but not limited to the flight data recorders described in U.S. Pat. Nos. 4,694,119 and 4,944,401 both to Gruenwegan, U.S. Pat. No. 4,600,449 to White et al., and U.S. Pat. No. 5,438,162 to Thompson et al., the disclosures of which are hereby incorporated by reference in their entirety. Generally, the thermally protected flight data recorders are one type of thermally protected enclosures which include an outer housing, the heat sensitive devices for recording data, and the heat absorption (i.e., thermal protecting) composition of the present invention.

Figure 2:
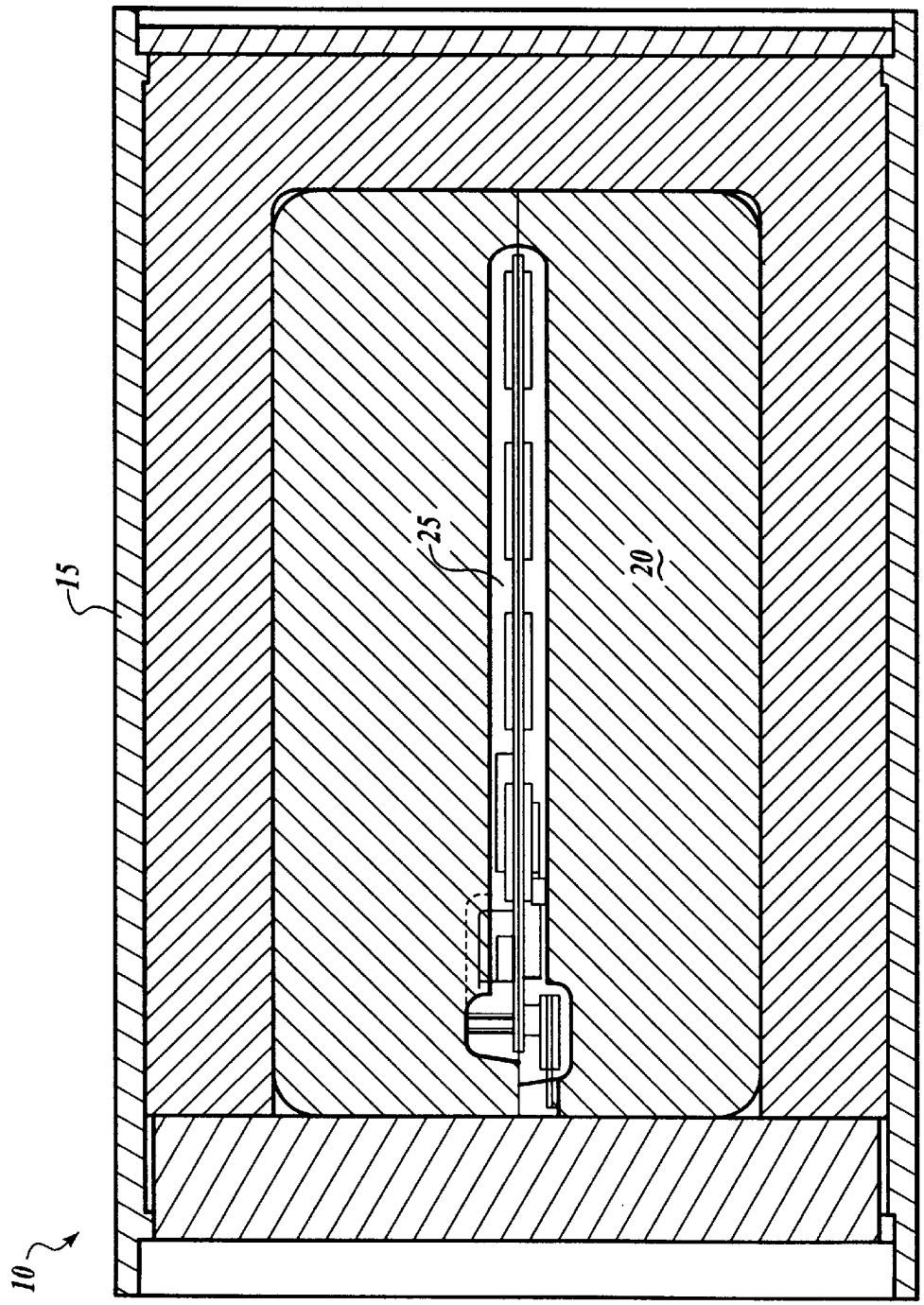
FIG. 2 is a cross-section of the thermally protected enclosure according to the present invention.

Referring to FIG. 2, the outer housing 15 of the enclosure 10 is typically constructed of a metal that exhibits a high thermal conductivity and high resistance to crushing and piercing. An intumescent coating or paint is generally applied to the exterior surfaces of the outer housing 15 for additional thermal insulation. The enclosure 10 may be provided in any suitable shape, and is typically substantially rectangular in cross-section when viewed perpendicular to each of its major axes. An insulating layer of solid material that exhibits a relatively low thermal conductivity adjoins each interior surface of the outer housing 15 to form a rectangular interior cavity that is centrally located within the outer housing. As noted above, the housing 15 may be designed to permit the escape of gaseous carbon dioxide which is produced in the endothermic decomposition of the bicarbonate compound.

The one or more heat sensitive devices 25 employed in the enclosure 10 are located within and contained by the interior cavity of the housing 15. In a preferred embodiment of the invention, the heat sensitive devices 25 are solid state electronic memory devices for storing data which is to be recovered from each of the solid state electronic memory devices following exposure of the enclosure to a high temperature environment. Examples of such devices include semiconductor electronically erasable programmable read-only memory circuits. A data acquisition unit periodically supplies digital signals which are sequentially written into the semiconductor memory circuits so that the memory circuits store a sequence of digital words that is a time sampled data representation of the history for each parameter being monitored. Typically, with respect to currently employed techniques, data compression is generally employed to allow storing digital signals representative of a 15–30 minute time history for each monitored parameter.

To provide the heat shielding necessary to protect these heat sensitive devices 25 from a high temperature environment to which the enclosure 10 is subjected, the composition 20 of the present invention is provided in the open spaces of the interior cavity of the housing 15, substantially surrounding the heat sensitive devices 25. The composition occupies at least a portion of the interior cavity. The compositions of the present invention are formable under low pressure and at temperatures below the melting point of either component, as discussed above. Accordingly, the composition may be molded to both conform to the shape of the interior cavity and to surround the heat sensitive devices therein.

The compositions of the present invention do not combust within the enclosure. The compositions of the present invention also absorb radiant heat from any residual insulation and from the interior surfaces of the enclosure. This heat is subsequently carried outside the container and disposed of in the flame front rather than building up inside the small cavity containing the heat sensitive devices.

In addition to their utility as heat absorbing materials, the compositions of the present invention, particularly those compositions which include larger amounts of binder, are also useful in enclosures such as flight data recorders for their shock absorbing properties. For example, the enclosure may be subjected to intense shock in the area of 3400 Gs on impact during crash conditions. Under such physical impact force, the compositions of the present invention absorb a portion of the shock by deforming only enough to divert the impact shock wave away from the memory device, but not enough to penetrate any surrounding insulation creating voids that might become heat flux paths to the heat sensitive devices. The density of the composition is naturally appropriate for this application.

Although the essential elements of the enclosure include only the housing, the heat sensitive devices, and the composition of the present invention, one skilled in the art can envision a number of modifications to the enclosure which are based upon conventional technology in the art of flight data recorders, and are therefore contemplated by the instant invention. For example, it may be desirable to include as another element of the enclosure, a thermal insulating layer between the compositions of the present invention and the interior surfaces of the interior cavity. Suitable thermal insulating liners will be readily determinable by those skilled in the art and include a shell-like thermal liner positioned within the interior cavity adjacent to the interior surfaces of the interior cavity, which conforms to the geometric shape of the interior cavity. Preferably, the thermal liner is a unitary structure formed of a solid material that is a good thermal insulator (i.e., has a low thermal conductivity, K) and relatively low density. Examples of such materials include but are not limited to thermal insulators sold under the tradenames MIN-K 2000®, from Johns-Manville Co., of Denver Colo., and MICROTHERM®, from Upton-Wirral Merseyside, England.

The foregoing is illustrative of the present invention and is not to be construed as limiting thereof. The invention is defined by the following claims, with equivalents of the claims to be included therein.

That which is claimed is:

1. A method for dissapating heat away from a heat sensitive device which is exposed to a high temperature environment, said method comprising: enclosing said heat sensitive device with a composition comprising:
    a) between about 10 percent and about 99 percent by weight of a bicarbonate compound; and
    b) between about 90 percent and about 1 percent by weight of a binder;

wherein, said bicarbonate compound undergoes endothermic decomposition when exposed to said high temperature environment, and wherein said composition absorbs heat from said high temperature environment during said endothermic decomposition of said bicarbonate compound and thereby dissipates heat away from said heat sensitive device.

2. The method of claim 1, wherein said composition comprises
    c) between about 70 percent and about 99 percent by weight of said bicarbonate compound; and
    d) between about 30 percent and about 1 percent by weight of said binder.

3. The method of claim 1, wherein said composition comprises
    c) about 95 percent by weight of said bicarbonate compound; and
    d) about 5 percent by weight of said binder.

4. The method of claim 1, wherein said bicarbonate compound comprises bicarbonate of soda.

5. A method for dissapating heat away from a heat sensitive device which is exposed to a high temperature environment, said method comprising:
    enclosing said heat sensitive device with a composition comprising between about 10 percent and about 100 percent by weight of a bicarbonate compound;
    wherein, said bicarbonate compound undergoes endothermic decomposition when exposed to said high temperature environment, and wherein said composition absorbs heat from said high temperature environment during said endothermic decomposition of said bicarbonate compound and thereby dissipates heat away from said heat sensitive device.

6. The method of claim 5, wherein said bicarbonate compound comprises bicarbonate of soda.

7. A method for dissipating heat away from a heat sensitive device which is exposed to a high temperature environment, said method comprising substantially enclosing said heat sensitive device with a composition comprising between about 10 percent and about 100 percent by weight of a bicarbonate compound; and
    wherein, said bicarbonate compound undergoes endothermic decomposition when exposed to said high temperature environment, and wherein said composition absorbs heat from said high temperature environment during said endothermic decomposition of said bicarbonate compound and thereby dissipates heat away from said heat sensitive device.

8. The method of claim 7 wherein said bicarbonate compound comprises bicarbonate of soda.

* * * * *

UNITED STATES PATENT AND TRADEMARK OFFICE
CERTIFICATE OF CORRECTION

PATENT NO. : 6,078,011  
DATED : June 20, 2000  
INVENTOR(S) : Jane Ren et al.

Page 1 of 1

It is certified that error appears in the above-identified patent and that said Letters Patent is hereby corrected as shown below:

Title Page,
Item [56], add the following:

-- [56]                     References Cited

U.S. PATENT DOCUMENTS

| | | | |
|---|---|---|---|
| 3,634,136 | | 1/1972 | French et al. | 117/214 |
| 4,944,401 | | 7/1990 | Groenewegen | 206/521 |
| 5,254,332 | | 10/1993 | Grezcyn et al. | 424/66 |
| 5,438,162 | | 8/1995 | Thompson et al. | 174/52.2 |
| 5,932,839 | * | 8/1999 | Ren et al. | 174/17SF |

FOREIGN PATENT DOCUMENTS

| | | |
|---|---|---|
| 1492660 | 10/1993 | United Kingdom |
| 3-174481 | 7/1991 | Japan |
| 99/2360 | 5/1999 | WO |

Signed and Sealed this

Fifteenth Day of January, 2002

Attest:

JAMES E. ROGAN  
Attesting Officer    *Director of the United States Patent and Trademark Office*